United States Patent [19]

Tabata et al.

[11] Patent Number: 4,985,071
[45] Date of Patent: Jan. 15, 1991

[54] PROCESS FOR PRODUCING A BASE METAL THIN FILM AND AN ELECTRONIC DEVICE USING THE SAME

[75] Inventors: Munehiro Tabata, Ibaraki; Chiharu Hayashi, Hirakata; Yasuhito Isozaki, Neyagawa; Kazuyuki Okano, Katano; Yo Hasegawa, Nara, all of Japan

[73] Assignee: Matsushita Electric Industrial Co., Ltd., Osaka, Japan

[21] Appl. No.: 298,889

[22] PCT Filed: May 20, 1988

[86] PCT No.: PCT/JP88/00478
§ 371 Date: Jan. 12, 1989
§ 102(e) Date: Jan. 12, 1989

[87] PCT Pub. No.: WO88/09395
PCT Pub. Date: Dec. 1, 1988

[30] Foreign Application Priority Data

May 20, 1987 [JP] Japan ............................ 62-122948
Aug. 26, 1987 [JP] Japan ............................ 62-211999

[51] Int. Cl.⁵ ............................................. B22F 9/00
[52] U.S. Cl. ................................... 75/246; 75/228; 419/23; 419/53; 419/54; 419/57; 419/58; 427/123; 427/383.1; 427/383.3; 427/383.5

[58] Field of Search ............... 427/123, 383.1, 383.3, 427/383.5; 419/23, 53, 54, 57, 58; 75/228, 246

[56] References Cited

U.S. PATENT DOCUMENTS

| | | | |
|---|---|---|---|
| 3,265,526 | 8/1966 | Beer | 117/50 |
| 3,622,367 | 11/1971 | Haag | 117/37 R |
| 3,914,517 | 10/1975 | Pirooz | 428/433 |
| 4,077,854 | 3/1978 | Estep et al. | 204/37 R |
| 4,140,817 | 2/1979 | Brown | 427/96 |
| 4,328,048 | 5/1982 | Senda et al. | 148/6.31 |
| 4,358,475 | 11/1982 | Brown et al. | 427/34 |
| 4,731,257 | 3/1988 | Uchikawa | 427/122 |

*Primary Examiner*—Stephen J. Lechert, Jr.
*Assistant Examiner*—Leon Nigohosian, Jr.
*Attorney, Agent, or Firm*—Stevens, Davis, Miller & Mosher

[57] ABSTRACT

A process for producing a thin film of a base metal on a substrate which comprises thermally decomposing in oxidative atmosphere an organic or inorganic compound containing a base metal compound formed on a substrate to form the oxide of the metal and then reducing the oxide by heat-treating it in reductive atmosphere. A temperature sensor, magnetic sensor, and ceramic wiring substrate utilizing the base metal thin film.

9 Claims, No Drawings

PROCESS FOR PRODUCING A BASE METAL THIN FILM AND AN ELECTRONIC DEVICE USING THE SAME

TECHNICAL FIELD

The present invention relates to a base metal thin film which can be widely used in a variety of electronic devices, a process for producing the same, and electronic devices using the same.

BACKGROUND ART

A variety of metal thin films have been widely used up to the present in various electronic devices such as resistors, electrodes and sensors. Among the metal thin films, those of noble metals can be easily produced by vacuum technologies including spattering and vacuum deposition as well as by coating followed by thermal decomposition of precious metal resinates. As to base metal thin films, however, application of vapor technology has been the sole means for their production. Although preparation of base metal thin films by means of plating has been studied in certain cases, it has been difficult to obtain a thin film having the thickness of 1 μm or thinner which has a uniform thickness over a wide area of the thin film by such means. Further, a method for preparing a base metal thin film is known which comprises by forming an organometallic compound layer on a substrate and then heat treating said layer in an inert gas or reductive atmosphere [cf. for example, Solid State Technology, February, p.p. 49 (1974)], but such method has the disadvantage of leaving carbon residue in the resulting film.

The above-mentioned prior art methods for producing metal thin film by using vacuum technology have a number of problems, thus, such methods require an expensive production apparatus, also, they are poor in productivity because they are run by batch-wise production process. Further, thin film having large area can hardly be produced, because such method require a vacuum vessel.

DISCLOSURE OF THE INVENTION

The first object of the present invention is to provide a base metal thin film and a process for producing the same which is low in cost, excellent in productivity, capable of easily producing a thin film of large area, and free from the above-mentioned problems pertaining to the prior art production of base metal thin film. The second object of the present invention is to provide a variety of electronic devices taking advantage of the characteristic of the base metal thin film produced by the process set forth below.

For the purpose of to attain the above-mentioned objects, according to the present invention, a layer of compound which comprises an organic compound containing a base metal in the molecular structure is formed on a substrate by use of various conventional printing techniques, then the compound layer is thermally decomposed in an oxidative atmosphere into the layer of the oxide of said metal, and further the resulting layer of the oxide of said metal is heat-treated in a reductive atmosphere to form the intended thin film of said base metal.

The base metal thin films produced according to the process of the present invention do not differ in appearance from those produced by a conventional vacuum process and may be applied also in general uses including decorations and the like. However, the electric and other properties of the base metal thin film thus obtained can be regulated by controlling the conditions of heat treatment conducted in reductive atmosphere.

According to the process of the present invention, since it uses a printing technique in forming on a substrate a compound layer containing a base metal, patterned thin film may also be produced without difficulty. Further, it is well known that the cost of such printing apparatus are much lower than the cost of vacuum apparatuses.

Although it is already a well-known technique to laminate a layer of a compound containing a base metal onto a substrate and then thermally decompose the compound to form a thin film of base metal oxide, the present inventors have found that, contrary to previous expectation, a base metal thin film of excellent homogeneity can be obtained by heat treatment at a relatively low temperature when said thin film of base metal oxide is heat-treated in reductive atmosphere. This fact has never been reported previously in any prior art reference.

As a general idea on metal sintering, it has been recognized as a common knowledge that, as can be seen in "KINZOKU BINRAN" (Handbook of Metals) (edited by Japan Inst. of Metals, 4th revised edition, 1982), p. 1399, the sintering of metals requires a high temperature in the range of 750° to 1300° C., except for the case of sintering aluminum alloys, and such a higher temperature has been actually required in practice.

In contrast, according to the process of the present invention, a thin film of a base metal having good quality can be obtained by heat-treating a layer of the oxide of the base metal in reductive atmosphere at a relatively lower temperature of 600° C. or lower. Thus, the present process is utterly different from the prior art techniques.

On observation of the base metal thin film thus obtained with a high resolution scanning electron microscope, it is recognized that the film is formed of the sintered extremely fine base metal particles. The particle diameters of the base metal particles are in the range of 50 to several thousand angstroms, and the particle size, state of sintering, etc. can be regulated by controlling the heat treatment conditions conducted in reductive atmosphere.

BEST MODE FOR CARRYING OUT THE INVENTION

The most suitable materials and process steps for use in the present invention will be described below.

The organic compounds containing a base metal in the molecular structure include various alkoxides, various carboxylic acid salts, various organic complex compounds, metallocenes and various organometallic compounds, of the base metal. These organic compounds containing a base metal are already known for almost all of the base metals and they can be easily synthesized or can be obtained in the market.

Various methods of coating known to the art may be used as the means for forming the layer of an organic compound containing a base metal in the molecular structure on a substrate. That is, ink is prepared by dissolving a compound containing a base metal into a solvent and optionally adding thereto a resin which will serve as a viscosity increasing agent; it is then applied onto a substrate by use of various conventional coating methods including screen printing, roll printing, gravure printing, offset printing, spraying, dipping, spin coating, scraping, and the like to form a layer on an organic compound containing the base metal on the substrate.

The thermal decomposition conditions of compound containing the base metal in oxidative atmosphere may vary depending on the kind of the compound used and on the intended properties and uses of the objective base metal thin film. Temperature in the range of 200° to 700° C. are generally used.

The thermal decomposition is preferably carried out in an oxidative atmosphere containing oxygen. Especially, when an organic compound containing a base metal is used as the starting material, residual carbon will remain in the thin film of the base metal unless an oxidative atmosphere is used, leading to lower the purity of the thin film. When the amount of residual carbon is large, the thin film is possibly stained severely. While, even a slight amount of residual carbon exerts an adverse effect on the electric properties, including the temperature coefficient of resistance, of the resulting thin film.

For reduction treatment of the base metal oxide thin film formed by thermal decomposition, a temperature approximately in the range of 200° to 700° C. is preferable similarly to the above-mentioned thermal decomposition. Reduction treatment at too high a temperature causes non-uniform growth of the base metal particles and the resulting thin film may be poor in its continuity.

The reductive atmosphere used in the above-mentioned reduction treatment should usually have a hydrogen concentration of at least 0.1% by volume to cause the reduction to proceed. Since the long reaction time is required when the hydrogen concentration in the reductive atmosphere is in the neighborhood of the above-mentioned minimum value, the concentration of hydrogen may preferably be 1% by volume or higher from practical standpoint.

EXAMPLE

The present invention will be illustrated below with reference to Examples.

Example 1

A solution prepared by dissolving nickel 2-ethylhexanoate in a petroleum solvent was spin-coated on a soda-lime glass plate. Then the coated solution on the plate was dried to remove the solvent to form a nickel 2-ethylhexanoate layer on the glass plate The formed layer was then thermally decomposed in the air at 500° C. to form a nickel oxide layer on the glass plate. Then the glass plate was placed in a tube furnace and was heat treated in a nitrogen stream containing 5% by volume of hydrogen at 400° C. for 30 minutes. Resultantly, it was confirmed that a uniform semitransparent nickel thin film having about 500A° in thickness was formed on the glass plate. The nickel thin film thus obtained showed a specific volume resistivity of $1 \times 10^{-4}$ $\Omega$.cm.

EXAMPLE 2

The same procedures employed in Example 1 were applied except that an equimolar mixture of nickel 2-ethylhexanoate and cobalt 2-ethylhexanoate was used in place of nickel 2-ethylhexanoate used in Example 1. The nickel-cobalt alloy thin film thus obtained was very uniform and showed similar magnetoresistive characteristics to those of the thin film of said alloy prepared separately by conventional vacuum deposition method.

EXAMPLE 3

A solution prepared by dissolving copper resinate in a terpenic solvent was printed in a pattern form on an alumina substrate by means of screen printing to form a copper resinate layer on the substrate. The substrate was heated at 600° C. to effect thermal decomposition and then subjected to reduction treatment by heating it under conditions similar to those employed in Example 1. Resultantly, a pattern of metallic copper was formed on the alumina substrate.

EXAMPLE 4

A cellulosic resin was added and dissolved into the nickel 2-ethylhexanoate solution used in Example 1, whereby an ink with excellent characteristics for screen printing was obtained. The ink was screen-printed on a glass plate to form a nickel 2-ethylhexanoate layer on the glass plate. Then the nickel 2-ethylhexanoate layer on the glass plate was treated under conditions similar to those employed in Example 1 to give a nickel thin film pattern having 2500 Å film thickness.

Thus obtained nickel thin film showed a specific volume resistance of $6 \times 10^{-5}$ $\Omega$.cm, and showed a temperature coefficient of resistance of 4800 ppm in the range of -55° C. to 150° C. The characteristics in change of resistance with temperature showed a linear characteristic. Thus, the thin film can be used as a temperature sensor having a higher sensitivity than that of a conventional platinum temperature sensor.

EXAMPLE 5

The same ink as used in Example 4 was applied onto a glass plate using a roll coater to form a nickel 2-ethylhexanoate layer on the glass plate. Then the nickel 2-ethylhexanoate layer on the glass was treated under same conditions similar to those employed in Example 4, whereby a uniform nickel thin film was formed on a glass plate of 20 cm × 30 cm in dimension.

EXAMPLE 6

Ferrocene, nickel 2-ethylhexanoate, and cobalt 2-ethylhexanoate were mixed together so as to give a mixture having the molar ratio of iron, nickel and cobalt of 74:8:18, and the mixture was dissolved in an aromatic solvent to prepare a coating solution. The coating solution was spin coated onto a glass plate and then treated under same conditions similar to those employed in Example 1, whereby a stainless steel alloy thin film was formed on the glass substrate. The heating temperature for reduction treatment herein used was 600° C.

INDUSTRIAL APPLICABILITY

As described above, the base metal thin film and the process for producing the same according to the present invention can provide a base metal thin film having characteristics that could not be hitherto obtained without using an expensive vacuum apparatus, merely by the use of inexpensive apparatuses, namely a printing apparatus and a furnace with appropriate atmosphere for effecting oxidative thermal decomposition and reductive heat treatment, and yet in good productivity. Thus, the present invention is of high value for industrial application.

We claim:

1. A process for producing a base metal thin film which comprises forming on a substrate a layer of an organic compound containing a base metal in the molecular structure, thermally decomposing the organic compound layer containing the base metal in the molecular structure in oxidative atmosphere into the oxide of the base metal, and then heat-treating the base metal oxide in reductive atmosphere.

2. A base metal thin film according to claim 1 wherein the base metal is nickel.

3. A base metal thin film wherein the thin film is formed of a sintered fine metal particles of 50 to 2000 Å.

4. A base metal thin film according to claim 1 wherein the base metal is an alloy of nickel and cobalt.

5. A base metal thin film according to claim 1 wherein the base metal is copper.

6. A base metal thin film produced by the process according to claim 1.

7. A nickel thin film temperature sensor which is produced by the process according to claim 1.

8. A magnetoresistive element produced by the process according to claim 1.

9. A ceramic wiring board produced by the process according to claim 1.

* * * * *